(12) United States Patent
Konstantinov

(10) Patent No.: US 10,707,340 B2
(45) Date of Patent: Jul. 7, 2020

(54) LOW TURN-ON VOLTAGE SILICON CARBIDE RECTIFIERS

(71) Applicant: SEMICONDUCTOR COMPONENTS INDUSTRIES, LLC, Phoenix, AZ (US)

(72) Inventor: Andrei Konstantinov, Sollentuna (SE)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 16/124,413

(22) Filed: Sep. 7, 2018

(65) Prior Publication Data

US 2020/0083365 A1    Mar. 12, 2020

(51) Int. Cl.
| | |
|---|---|
| H01L 29/78 | (2006.01) |
| H01L 29/16 | (2006.01) |
| H01L 29/06 | (2006.01) |
| H01L 21/04 | (2006.01) |
| H01L 29/66 | (2006.01) |
| H01L 29/10 | (2006.01) |

(52) U.S. Cl.
CPC ........ *H01L 29/7806* (2013.01); *H01L 21/046* (2013.01); *H01L 21/0485* (2013.01); *H01L 21/0495* (2013.01); *H01L 29/0634* (2013.01); *H01L 29/1095* (2013.01); *H01L 29/1608* (2013.01); *H01L 29/66068* (2013.01)

(58) Field of Classification Search
CPC ............. H01L 29/7806; H01L 29/0634; H01L 21/0485; H01L 29/1608; H01L 21/046; H01L 29/66068; H01L 29/1095; H01L 21/049
See application file for complete search history.

(56) References Cited

U.S. PATENT DOCUMENTS

| | | | | |
|---|---|---|---|---|
| 4,866,315 A * | 9/1989 | Ogura | ................. | H01L 29/0834 327/376 |
| 4,984,049 A * | 1/1991 | Nishizawa | .......... | H01L 29/0834 257/136 |
| 5,202,750 A * | 4/1993 | Gough | ................ | H01L 29/7455 257/110 |

(Continued)

OTHER PUBLICATIONS

Lotfi et al. ("LDMOS-transistors on semi-insulating silicon-on-polycrystalline silicon carbide substrates for improved RF and thermal properties." Solid-State Electronics 70, pp. 14-19, 2012) (Year: 2012).*

(Continued)

*Primary Examiner* — Yasser A Abdelaziez
(74) *Attorney, Agent, or Firm* — Brake Hughes Bellermann LLP

(57) ABSTRACT

In a general aspect, a silicon carbide (SiC) rectifier can include a substrate of a first conductivity type, a drift region of the first conductivity type, a junction field effect transistor (JFET) region of the first conductivity type, a body region of a second conductivity type, an anode implant region of the first conductivity type, and a channel of the first conductivity type. The channel can be in contact with and disposed between the JFET region and the anode implant region. A portion of the channel between the anode implant region and the JFET region can be disposed in the body region, The channel can be configured to be off under zero-bias conditions, and on at a positive turn-on voltage.

20 Claims, 9 Drawing Sheets

(56) References Cited

U.S. PATENT DOCUMENTS

| | | | |
|---|---|---|---|
| 9,030,796 B2 | 5/2015 | Sarrus et al. | |
| 9,324,807 B1 | 4/2016 | Bhalla et al. | |
| 2011/0244644 A1* | 10/2011 | Zuniga | H01L 29/42368 438/286 |
| 2015/0129894 A1* | 5/2015 | Kinoshita | H01L 29/6606 257/77 |
| 2018/0076290 A1* | 3/2018 | Takayanagi | H01L 29/872 |

OTHER PUBLICATIONS

Wensuo Chen et al., "A Novel Low VF Super Barrier Rectifier With an N-Enhancement Layer," IEEE Electron Device Letters, vol. 38, No. 2, Feb. 2017.

Vladimir Rodov et al., "Super Barrier Rectifier—A New Generation of Power Diode," IEEE Translations on Industry Applications, vol. 44, No. 1, Jan./Feb. 2008.

Wensuo Chen et al., "Analyses aqnd Experiments of the Schottky Contact Super Barrier Rectifier (SSBR)," IEEE Electron Device Letters, vol. 38, No. 7, Jul. 2017.

Zehong Li, et al., "Innovative Buried Layer Rectifier with 0.1V Ultra-low Forward Conduction Voltage," Proceedings of the 2012 24th International Symposium on Power Semiconductor Devices and ICs, Jun. 3-7, 2012.

Woongji Sung et al., "On Developing One-Chip Integration of 1.2 kV SiC MOSFET and JBS Diode (JBSFET)," IEEE Transactions on Industrial Electronics, vol. 64, No. 10, Oct. 2017, p. 8206.

Shigeharu Yamagami et al., "Novel Low VON Poly-Si/4H—SiC Heterojunction Diode using Energy Barrier Height Control," Materials Science Forum vols. 717-720 (2012) pp. 1005-1008.

Tournier, Dominique, et al., "SiC Current Limiting FETs (CLFs) for DC applications", Materials Science Forum, vols. 778-780. Trans Tech Publications Ltd,, 2014, pp. 895-899.

\* cited by examiner

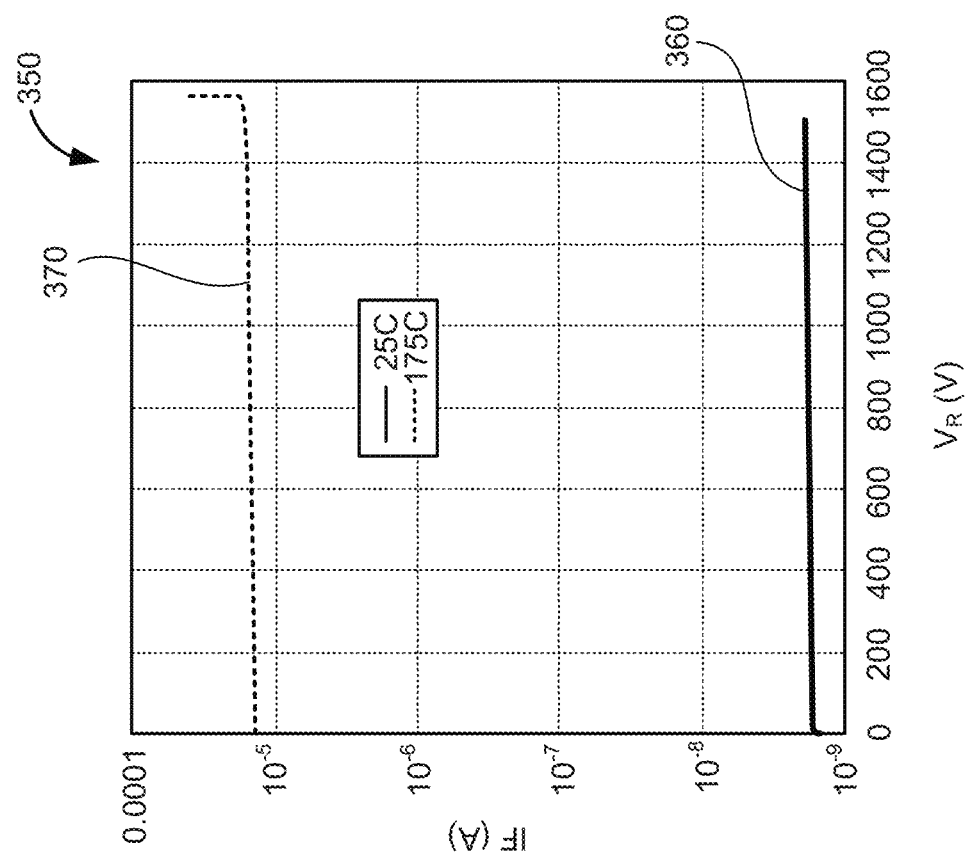
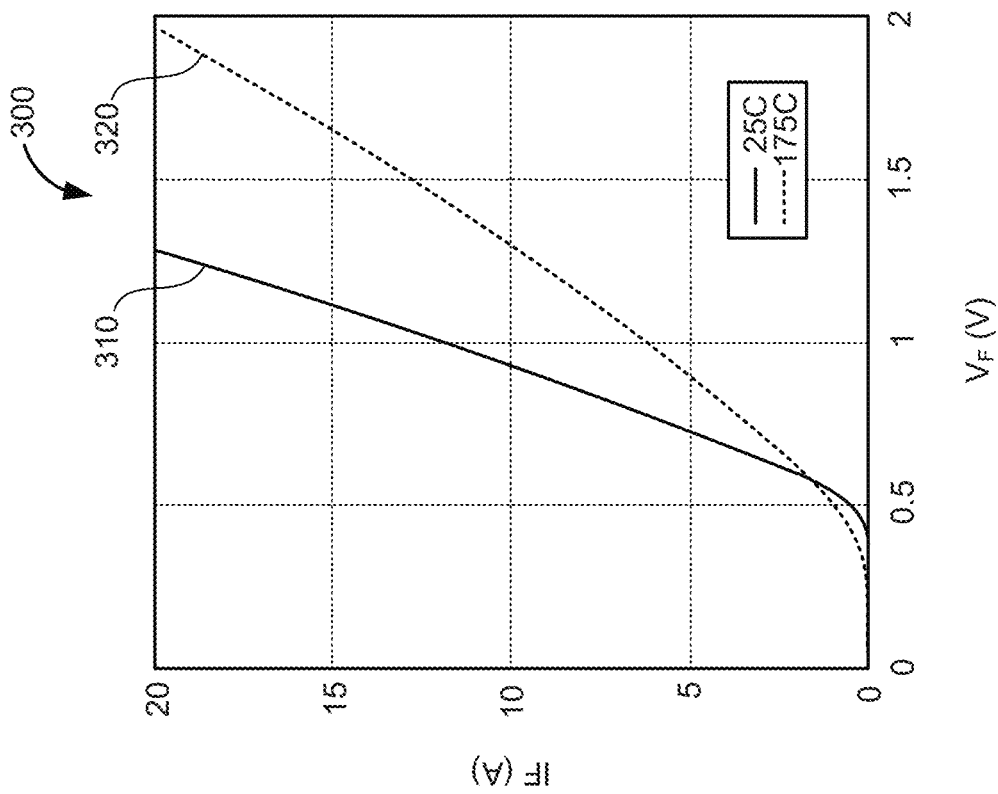
FIG. 3B
FIG. 3A

US 10,707,340 B2

LOW TURN-ON VOLTAGE SILICON CARBIDE RECTIFIERS

TECHNICAL FIELD

This description relates to silicon carbide (SiC) semiconductor devices that include low turn-on voltage rectifiers.

BACKGROUND

In power rectifiers, such as high voltage diode rectifiers, low turn-on voltage can reduce on state power loss. However, in current implementations, lowering turn-on voltage in a diode rectifier also lowers an associated energy barrier for reverse bias charge flow (e.g., reduces barrier height). Accordingly, such devices can experience high reverse bias (e.g., leakage) currents and, as a result, enter thermal runaway, particularly at high temperatures and/or under electrical overload conditions. Such thermal runaway can damage a semiconductor device including such a rectifier, as well as components coupled with the semiconductor device. Current high voltage rectifiers that are less susceptible to high reverse bias currents have forward voltage drops (turn-on voltages, etc.) that are higher than desirable.

SUMMARY

In at least one general aspect, a silicon carbide (SiC) rectifier can include a substrate of a first conductivity type. The substrate can be included in a cathode terminal of a rectifying diode. The rectifier can further include a drift region of the first conductivity type. The drift region can be disposed on the substrate. The rectifier can also include a junction field effect transistor (JFET) region of the first conductivity type. The JFET region can be disposed on the drift region. The rectifier can still further include a body region of a second conductivity type. The body region can be disposed in the JFET region. The rectifier can also further include an anode implant region of the first conductivity type. The anode implant region can be disposed in the body region. The anode implant region can be coupled with an anode terminal of the rectifying diode. The rectifier can also include a channel of the first conductivity type. The channel can be in contact with and disposed between the JFET region and the anode implant region. A portion of the channel between the anode implant region and the JFET region can be disposed in the body region. The channel can be configured to be off under zero-bias conditions, and on at a positive turn-on voltage.

BRIEF DESCRIPTION OF THE DRAWINGS

FIGS. 3A and 3B are graphs illustrating example operation of the SiC rectifier of FIG. 1.

Figure 1:
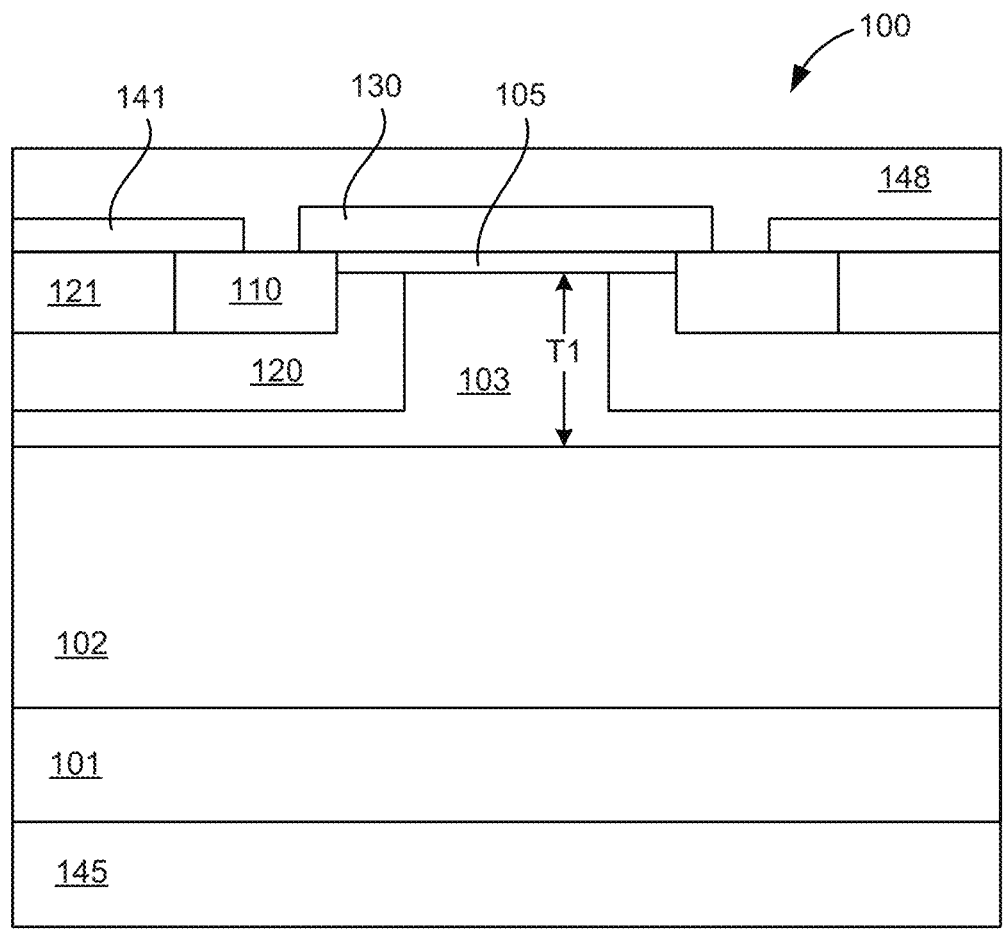
FIG. 1 is a diagram that schematically illustrates a side cross-sectional view of a silicon carbide (SiC) rectifier.

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings, but are provided for context between related views. Also, not all like elements in the drawings are specifically referenced with a reference symbol when multiple instances of an element are illustrated.

DETAILED DESCRIPTION

The present disclosure is directed to silicon carbide (SiC) rectifiers (e.g., diode rectifiers). In some implementations, the SiC rectifiers described herein can be used in high power applications, such as applications with a desired blocking voltage (e.g., under reverse bias conditions of a rectifying diode) of, for example, 600 volts (V) or greater. Such SiC rectifiers can have a controllable and low turn-on voltage (e.g., which can be established based on implant doses, implant depths, channel depths, etc.). For instance, in some implementations, a SiC rectifier can have a turn-on voltage of approximately 0.5 V under forward bias conditions, with a forward voltage drop of approximately 1 V at a forward current rating of the rectifier. For purposes of this disclosure, such SiC rectifiers can be referred to as low-turn-on (LTO) rectifiers.

Figure 4:
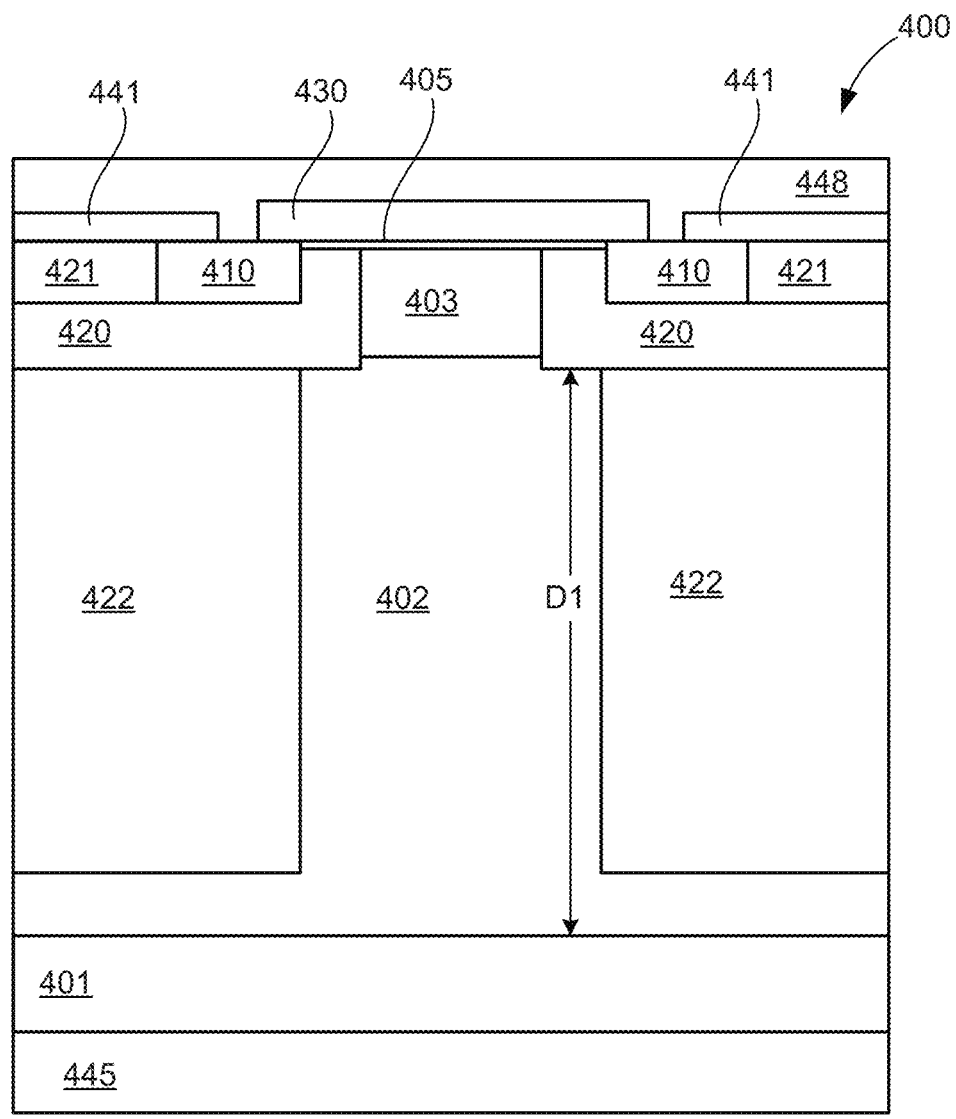
FIG. 4 is a diagram that schematically illustrates a side cross-sectional view of another SiC rectifier.
Figure 5:
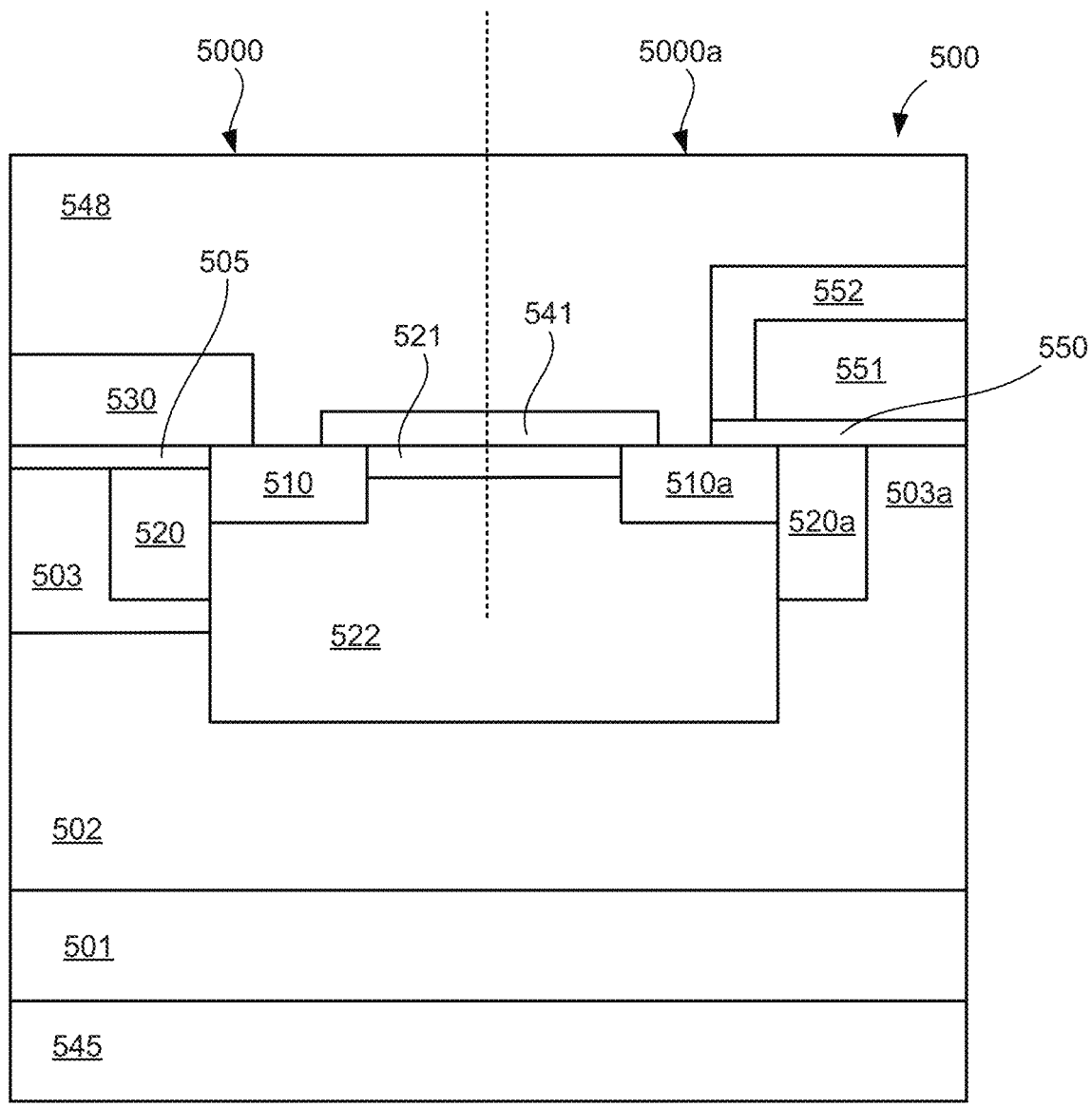
FIG. 5 is a diagram that schematically illustrates a side cross-sectional view of a SiC rectifier that is monolithically integrated with a metal-oxide-semiconductor field-effect transistor (MOSFET).

In some implementations, the LTO rectifiers described herein can have electrical performance parameters that are near-theoretical performance, e.g., with respect to blocking voltage and on-state resistance. For instance, a theoretical value (limit) for on-state specific resistance ($R_{spon}$) of a vertical non-injection power device (e.g., such as the SiC rectifiers described herein) can be determined based on a resistance of a drift region of the power device, such as a rectifying diode of a SiC rectifier. For instance, for a non-punch-through power device, $R_{spon}$ can be given by Equation 1 below:

$$R_{spon} = 4BV^{**}2/(epsilon^*mu^*E_c^{**}3) \quad \text{Equation 1,}$$

where BV is the breakdown voltage, epsilon is the absolute permittivity of a semiconductor in which the device is formed (e.g., SiC), mu the carrier mobility, and $E_c$ is the critical electric field for avalanche breakdown of the semiconductor. In some implementations, a high-power rectifier can be defined as a device (e.g., a rectifying diode) having a specific resistance, $R_{spon}$, that does not exceed 10 times the theoretical value of $R_{spon}$ given by Equation 1 above. For purposes of this disclosure, $R_{spon}$ can be a differential resistance of an on-state rectifier multiplied by an active area (e.g., in square centimeters) of the rectifying device, where the active area can be determined by multiplying an active area of a unit cell of the rectifying device by a number of unit cells included in the rectifying device. Examples of such unit cells are illustrated in FIGS. 1, 4 and 5, which are discussed below. In some implementations, the SiC rectifiers described herein can have current rating values (e.g., minimum current rating values) of between 4 amperes (A) and 10 A. It is noted that, although the example implementations are described in terms of certain conductivity types (e.g., P-type, N-type), in some implementations, these conductivity types can be reversed.

Figure 6:
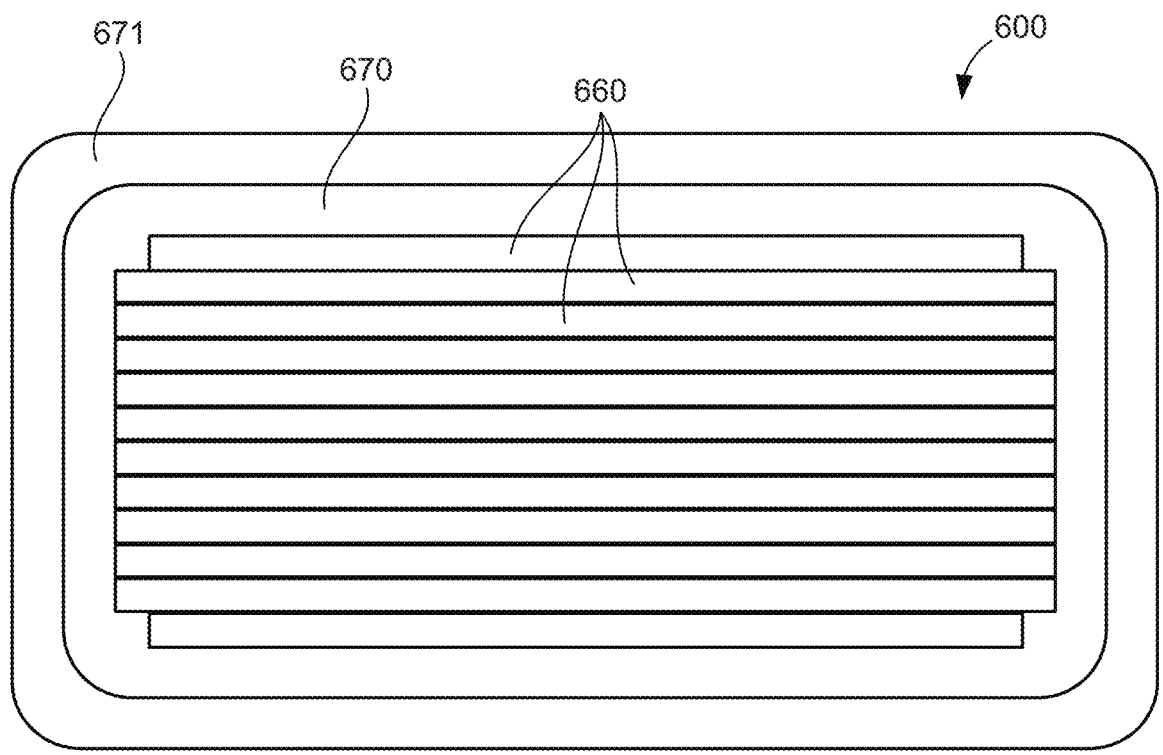
FIG. 6 is a diagram that schematically illustrates a plan view of a SiC rectifier.
Figure 7B:
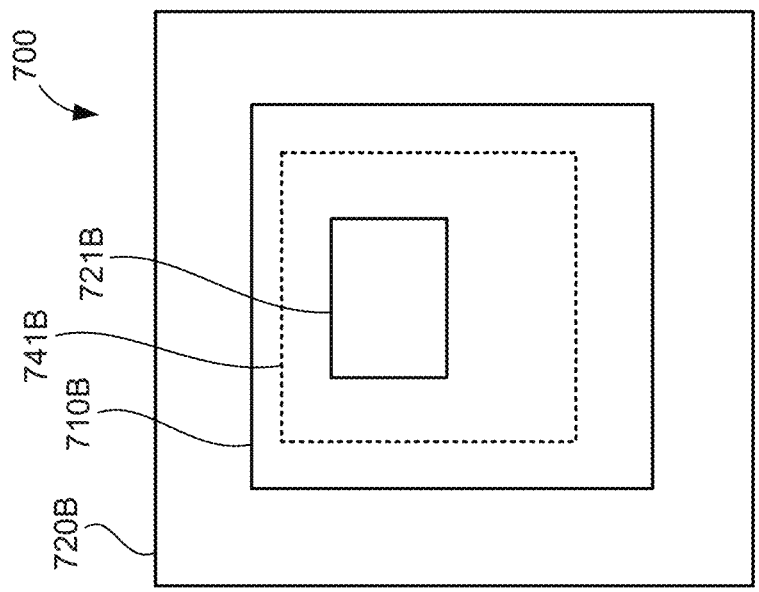
FIGS. 7A and 7B are diagrams that schematically illustrate plan views of unit cells of a SiC rectifier.
Figure 7A:
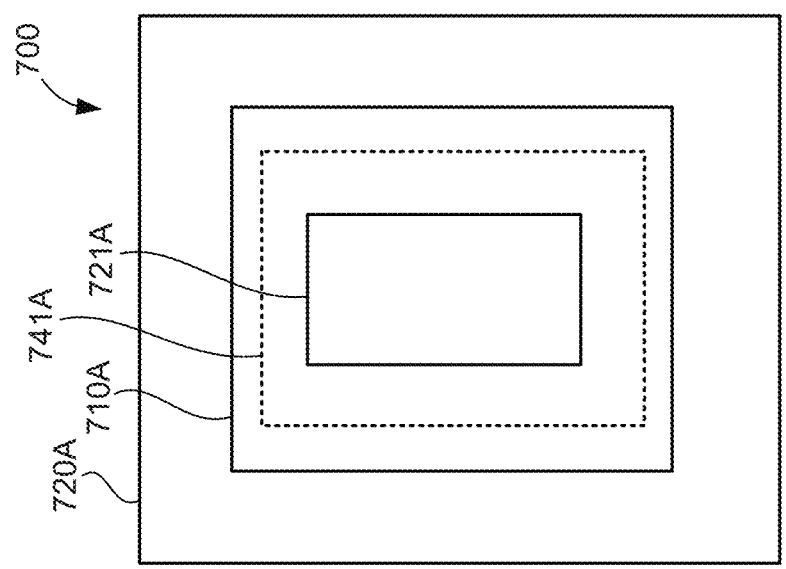

FIG. 1 is a diagram that schematically illustrates a side cross-sectional view of a SiC rectifier 100. The SiC (LTO) rectifier 100 shown in FIG. 1 can be a unit cell of a power rectifier, where a plurality of unit cells can be included in a SiC power rectifier. In the implementation of FIG. 1, the unit cell of the LTO rectifier 100 is symmetrical (e.g., has mirror symmetry left to right). In some implementations, a SiC rectifier can be implemented as a 1-dimensional array of linear unit cells (e.g., a plurality of unit cells aligned along a single line in a plan view) having a structure such as the LTO rectifier 100 shown in FIG. 1. An example of such an arrangement is shown in FIG. 6, which is discussed further below. In some implementations, a SiC rectifier can be implemented as a 2-dimensional array of rectangular (or square) unit cells having a structure such as (or similar to) the LTO rectifier 100 shown in FIG. 1. Example arrangements of such unit cells are shown in FIGS. 7A and 7B, which are discussed further below.

As shown in FIG. 1, the rectifier 100 can include an anode terminal 148 and a cathode terminal 145. The cathode terminal 145 can be implemented by a conductive layer (e.g., a metal layer) that forms (defines, etc.) an Ohmic contact with a low-resistivity (heavily doped) SiC substrate 101 of a first conductivity type, such as a heavily doped n-type SiC substrate. The LTO rectifier 100, as shown in FIG. 1, further includes a low-doped (n-type) drift region 102. In some implementations, a doping concentration of the drift region 102 can be less than a doping concentration of the substrate 101. In the rectifier 100, parameters for doping concentration and a thickness T1 of the drift region 102 can be configured to achieve, over a specified operating temperature range of the rectifier 100, a desired blocking voltage under reverse bias conditions without avalanche breakdown occurring.

A rectifying device portion of the rectifier 100 can include a field-effect controlled region. The field effect controlled region of the rectifier 100 can include an n+ region 110 (which can be referred to as anode implant region, an anode source region, etc.). The field-effect controlled region of the rectifier 100 can also an n-type (lateral) channel 105. The channel 105 (when on, or conducting) can electrically couple the anode implant region 110 to a vertical junction-field-effect transistor (JFET) channel region (JFET region) 103 (where the JFET region 103 is also included in the field-effect controlled region of the rectifier 100). In the rectifier 100, the vertical JFET channel 103 can electrically couple the lateral channel 105 with the drift region 102. In the some implementations the anode implant region 110 and the JFET region 103 can be normally on (e.g., conducting under zero bias, or reverse bias conditions), while the lateral channel 105 can be normally off (e.g., not conducting under zero bias, or reverse bias conditions).

Operation (pinch off and enhancement) of the channel 105 can be controlled by a body region 120 of a second, e.g., p-type, conductivity (e.g., that is disposed along a bottom of the channel 105 in FIG. 1) and a Schottky metal 130 (e.g., along a top of the channel 105 in FIG. 1), which forms a Schottky contact (e.g., barrier) with the channel 105. In some implementations, the p-body 120 and the Schottky metal 130 can be referred to, respectively, as a p-body gate and a Schottky gate of the channel 105. As shown in FIG. 1, in this example implementation, both the p-body gate (the p-body 120) and the Schottky gate (the Schottky metal 130) are shorted, via a metal layer implementing the anode terminal 148, to the anode implant region 110. Accordingly, from a circuit-schematic perspective, the anode implant region 110, the p-body region 120 and the Schottky metal 130, along with the metal layer used to implement the anode terminal 148 of the rectifier 100, can be considered to be included in an anode of a rectifying diode of the rectifier 100.

As shown in FIG. 1, the rectifier 100 includes a subcontact portion 121 that is disposed in the p-body region 120. In some implementations, the subcontact region 121 can have a high acceptor doping (e.g., a higher acceptor doping concentration than the p-body region 120) and an Ohmic contact 141 can be formed with the anode implant region 110, and with the subcontact region 121. The metal layer used to form the anode terminal 148, as shown in FIG. 1, can electrically couple the Ohmic contact 141 with the Schottky metal (Schottky gate) 130. As noted above, the rectifier 100 shown in FIG. 1 can be used to implement a SiC rectifier unit cell that is symmetrical, e.g., includes two identical and mirrored half-cells (one half-cell being the left half of FIG. 1, and the other half-cell being the right half of FIG. 1). In some implementations, a linear unit cell (such as shown in FIG. 6) can be implemented using the structure of the rectifier 100 shown in FIG. 1 (e.g., with the linear unit cell extending into and out of the page in FIG. 1). In some implementations, polygon shaped unit cells of a rectifier (such as shown in FIGS. 7A and 7B) can be implemented using the structure of the rectifier 100 shown in FIG. 1, or a similar unit cell structure.

In the rectifier 100, the channel 105 can remain off (e.g., normally off) at zero bias conditions and/or reverse (negative) bias conditions at the anode terminal 148 (e.g., relative to the cathode terminal 145). If a forward (positive) bias is provided to the anode terminal 148 (e.g., relative to the cathode terminal 145) the p-body gate 120 and the Schottky gate 130 can become positively biased with respect to the lateral channel (and the cathode terminal 145). Such a positive bias can turn on (enhance) the channel 105 so that it begins to conduct between the anode implant region 110 and the JFET region 103. Forward electron current can then flow through the drift region 102, through the JFET region 103, and through the (lateral) channel 105, as a result of the field-effect controlled region of the rectifier 100 (e.g., the channel 105) being turned on by the positive (forward) bias on the anode terminal 148.

Figure 2:
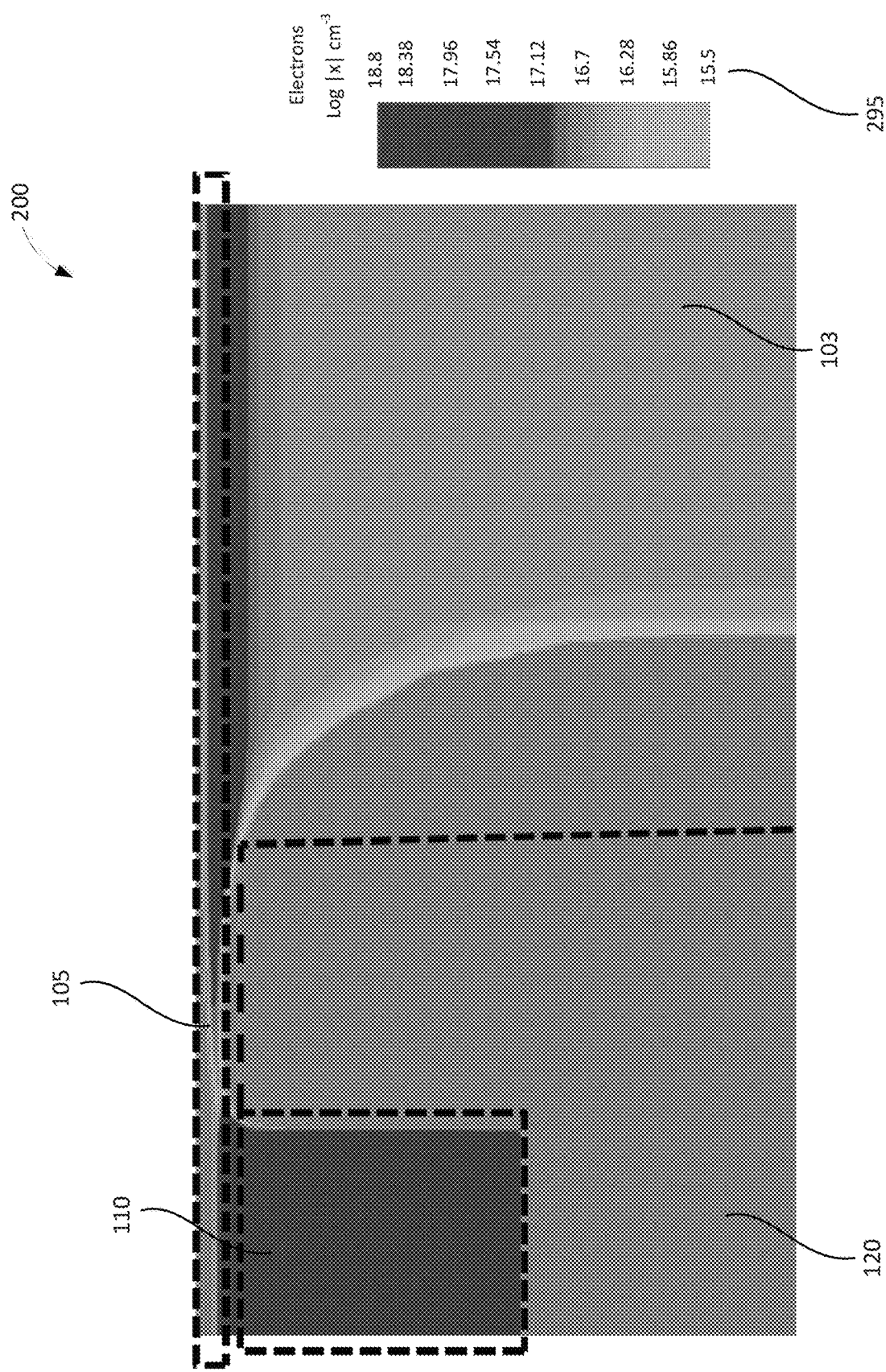
FIG. 2 is a diagram illustrating example electron concentration contours for the SiC rectifier of the FIG. 1.

FIG. 2 is a diagram 200 illustrating example electron concentration contours for an implementation of the SiC rectifier 100 of the FIG. 1. That is, the diagram 200 illustrates simulated contours of electron concentration for the JFET region 103, the channel 105, the anode implant region 110 and the p-body region 120 of an implementation of the rectifier 100. Legend 295 in FIG. 2 indicates, with grayscale tones, example electron concentrations in the diagram 200. For the example electron concentration contours shown in FIG. 2, a simulated forward bias $V_F$ of 1.1 V is applied to the anode terminal 148 (relative to the cathode terminal). In the example, a simulated forward current $I_F$ of 15 A (e.g., a specified current rating of the rectifier) was observed. As shown in FIG. 1, at a $V_F$ of 1.1 V, the channel 105 is enhanced such that the channel 105 is conducting forward electron current between the JFET region 103 and the anode implant region 110.

FIGS. 3A and 3B are graphs, 300 and 350 respectively, illustrating example operation (e.g., simulated electrical operating characteristics) of an implementation of the rectifier 100 of FIG. 1 (e.g., the implementation corresponding with FIG. 3) at 25 degrees Celsius (C) and 175 degrees C. As shown in the example implementation of FIG. 3A, the rectifier 100 can have a turn-on voltage of approximately 0.5V at both 25 degrees C. (line 310) and 175 C degrees C. (line 320). Further, as shown in the example implementation of FIG. 3B, the rectifier 100 can have a reverse current of approximately 1 nanoamp at 25 degrees C. (line 360) and a reverse current of a few tens of microamps at 175 degrees C. (line 370). In the illustrated implementation, drift region doping, substrate resistance and device area are simulated as being the same as a current rectifier implementation, which can have a turn on voltage of approximately 1.0 V (e.g., twice that of the implementation of the rectifier 100 corresponding with FIGS. 3A and 3B). In the implementation of FIGS. 3A and 3B, a forward current rating of 15A is achieved at a forward drop $V_F$ of 1.1 V. At high operation temperatures (e.g., 175 degrees C.), a resistance of the drift region 102 can dominate the electrical operation characteristics of the rectifier 100. This resistance can be decreased utilizing charge balance in the drift region, such as in the implementation shown in FIG. 4.

As indicated above, current Schottky barrier rectifiers (e.g., with a Ti Schottky barrier) can have a significantly higher forward voltage drop (e.g., approximately 2 times higher) than implementations of the rectifiers disclosed herein. The turn-on voltage of such current rectifiers can be approximately equal to a contact potential $V_c$ of a Schottky-barrier to n-type SiC (e.g., approximately 1 V). Such contact potential $V_c$ can be determined from a band diagram of a zero-biased Schottky barrier.

In view of the foregoing, and with reference to FIG. 1, it is desirable that a turn-on voltage $V_{on}$ of the rectifier 100 (e.g., $V_{on}$ of the channel 105) be less than $V_c$ of the Schottky contact formed between the Schottky metal 130 and the channel 105. If $V_{on}$ is equal to, or greater than $V_c$, anode current (e.g, current from the anode terminal 148) would predominantly flow through the Schottky junction to the channel 105, rather than from the anode implant region 110 thorough the channel 105 to the JFET region 103, which may be undesirable for achieving improved forward bias operating characteristics in the LTO rectifiers disclosed herein.

FIG. 4 is a diagram that schematically illustrates a side cross-sectional view of another SiC (LTO) rectifier 400. As with the rectifier 100 of FIG. 1, the SiC (LTO) rectifier 400 shown in FIG. 4 can be a unit cell of a power rectifier, where a plurality of such unit cells can be included in a SiC power rectifier. In the implementation of FIG. 4, as with the rectifier 100, the unit cell of the LTO rectifier 400 is symmetrical (e.g., has mirrored symmetry left to right). In some implementations, a SiC rectifier can be implemented as a 1-dimensional array (e.g., FIG. 6) of linear unit cells having a structure such as the LTO rectifier 400 shown in FIG. 4, or as a 2-dimensional array of rectangular (or square) unit cells (e.g. FIGS. 7A and 7B) having a structure such as (or similar to) the LTO rectifier 400.

As shown in FIG. 4, the rectifier 400 can include a substrate 401, a drift region 402, a JFET region 403, a channel 405, an anode implant region(s) 410, a body region(s) 420, a subcontact region(s) 421, a Schottky metal (Schottky gate) 430, an Ohmic contact(s) 441, a cathode terminal 445 and an anode terminal 448. These elements of the rectifier 400 can have similar properties and/or electrical function as, respectively, the substrate 101, the drift region 102, the JFET region 103, the channel 105, the anode implant region 110, the body region 120, the subcontact region 121, the Schottky metal (Schottky gate) 130, the Ohmic contact 141, the cathode terminal 145 and the anode terminal 148 of the rectifier 100 of FIG. 1. Accordingly, for purposes of brevity, these elements of the rectifier 400 are not discussed in detail again here with respect to FIG. 4.

As shown in FIG. 4, the rectifier 400 can also include charge balance p-bodies 422 (e.g., charge balance pillars), where the charge balance p-bodies 422 penetrate (extend) into the drift region 402 of the rectifier 400. In some implementations, the charge balance p-bodies 422 can extend into the drift region 402 to, at least, approximately one-half a depth D1 of the drift region 402, or more. In some implementations, the charge-balance p-bodies 422 can extend through the drift region 402 and terminate at the n+ substrate 401 of the rectifier 400.

In some implementations, the charge balance p-bodies 422 can allow for donor charge in conductive channels (e.g., the drift region 402) to be increased without causing a significant increase in electric field. Accordingly, the use of the charge balance p-bodies can allow for reducing $R_{spon}$ of the rectifier 400, without adversely affecting (significantly adversely affecting) a blocking (reverse bias) voltage of the rectifier 400.

In some implementations, average lateral charge of non-compensated acceptors in the charge balance p-bodies 422 can be substantially close to an average lateral donor charge of non-compensated donors in the n-type portion of the drift region 402. Average donor charge $Q_d$ can be defined as a total amount of non-compensated donors in the drift region 402 divided by the active device area. Acceptor charge $Q_a$ can be defined as a number of non-compensated acceptors in the charge balance p-bodies 422 divided by active device area. In some implementations, donor charge $Q_d$ and acceptor charge Qa can have a deviation (e.g., a charge imbalance) of, for example, around 1e13 $cm^{-2}$ or lower. In some implementations, a charge imbalance of greater than, for example, 1e13 $cm^{-2}$ in the rectifier 400 may result in premature avalanche breakdown (e.g., avalanche breakdown below a desired blocking voltage).

Operation of the rectifying part of the charge-balanced LTO diode of the rectifier 400 can be similar to operation of the rectifying diode of the rectifier 100 described above with respect to FIG. 1. Briefly, in the rectifier 400, the lateral channel 405 is formed on top of p-body regions 420, so as electrically connect (when the channel 405 is turned on) the anode implant region (anode source implant) 410 to the (vertical) JFET channel region 403. Further in the rectifier 400, an Ohmic contact 441 can be formed on top of the anode implant region 410, as well as on top of the subcontact p+ region 421. In some implementations, the Ohmic contact 441 can, for example, be formed using nickel silicide (NiSi) or cobalt silicide ($CoSi_2$). The Schottky gate of the rectifier 400 is formed by (defined by, implemented by, etc.) the Schottky barrier material 430. In some implementations, the Schottky barrier material can be titanium (Ti), nickel (Ni), chromium (Cr), NiSi, or heavily doped p-type polysilicon. The gate 430 and the Ohmic contact 441 can be interconnected with a metal layer used to implement the anode terminal 448.

Desired properties, and operation of the n-type channel 405 can be the same as, or similar to those of the lateral channel 105 discussed above with respect to the rectifier 100 of FIG. 1. That is, the channel 405 can be normally off, and the channel 405 can be configured to turn on at a forward bias voltage $V_{on}$ that is less than contact potential $V_c$ of a Schottky contact formed between the Schottky metal layer 430 and the channel 405. Further, the channel 405 should have low resistance ($R_{spon}$) under on-state (forward bias) conditions of the rectifying diode of the rectifier 400.

FIG. 5 is a diagram that schematically illustrates a side cross-sectional view of a SiC rectifier and a monolithically integrated metal-oxide-semiconductor field-effect transistor (MOSFET) 500, which for purposes of the following discussions can be referred to as cell 500. In the cell 500, a rectifying diode can be configured as an antiparallel diode with the monolithically integrated MOSFET. Similar to the rectifier 100 of FIG. 1 and the rectifier 400 of FIG. 4, the cell 500 of FIG. 5 can be a unit cell (or half unit cell) of a monolithically integrated power rectifier and MOSFET, where a plurality of the cells 500 (e.g., mirrored and electrically coupled in parallel) can be included in a single SiC device.

In the implementation of FIG. 5, in contrast with the rectifiers 100 and 400, the cell 500 is not symmetrical (e.g., is asymmetrical, does not have mirrored symmetry left to right), as the left side of the cell 500 includes (implements, etc.) a power diode rectifier portion, while the right side of the cell 500 includes (implements, etc.) a monolithically integrated MOSFET portion. In some implementations, a SiC rectifier and monolithically integrated MOSFET can be implemented as a 1-dimensional array (e.g., FIG. 6) of linear unit cells having the structure of the cell 500 shown in FIG. 5 (e.g., mirrored as described herein), or as a 2-dimensional array of rectangular (or square) unit cells (e.g. FIGS. 7A and 7B) having a structure such as (or similar to) the cell 500 (e.g., mirrored as described herein).

As shown in FIG. 5, the cell 500 can include a substrate 501, a drift region 502, a JFET region 503, a channel 505, an anode implant region 510, a body region 520, a subcontact region 521, a Schottky metal (Schottky gate) 530, an Ohmic contact 541, a cathode terminal 545 and an anode terminal 548. These elements of the cell 500 can have similar properties and/or electrical function as, respectively, the substrate 101, the drift region 102, the JFET region 103, the channel 105, the anode implant region 110, the body region 120, the subcontact region 121, the Schottky metal (Schottky gate) 130, the Ohmic contact 141, the cathode terminal 145 and the anode terminal 148 of the rectifier 100 of FIG. 1. Accordingly, for purposes of brevity, these elements of the cell 500 are not discussed in detail again here with respect to FIG. 5.

As shown in FIG. 5, the cell 500, as shown by the dashed line in FIG. 5, can include (e.g., can be schematically separated into) sub-cells 5000 and 5000a, where the sub-cell 5000 includes the rectifying (antiparallel) diode portion of the cell 500, and the sub-cell 5000a includes the monolithically integrated MOSFET portion of the cell 500.

In the cell 500 of the FIG. 5, the sub-cells 5000 and 5000a share the same substrate 501 and the same drift region 502 (e.g., the substrate 501 and the drift region 502 are common the sub-cells 5000 and 5000a). Similarly to the rectifiers 100 and 400, the (lateral) channel 505 of the cell 500 is disposed on the p-body (p-body gate) 520, while the Schottky metal (Schottky gate) 530 is disposed on the lateral channel 505 (e.g., on a side of the lateral channel 505 opposite the p-body 520. The channel 505 (e.g., when gated on, or turned on by a forward bias voltage applied to the p-body 520 and/or the Schottky metal 530) electrically connects the anode implant (e.g., n+ region) 510 to the vertical JFET channel region 503.

In some implementations, a configuration (e.g., arrangement) of the elements of the sub-cell 5000 (and the cell 500) may be slightly different from that of the rectifier 100. For instance, as shown in FIG. 5, the cell 500 includes a deep p-body region 522. The deep p-body region 522 (which is common to the sub-cell 5000 and the sub-cell 5000a) extends into the drift region 502, to depth that is deeper than a depth of the p-body 520, where the p-body 520 can terminate a depth that is within the JFET region 503. The deep p-body region can electrostatically shield both elements of the sub-cell 5000 and elements of the sub-cell 5000a. For instance, such an arrangement may provide electric field shielding under high reverse bias conditions (e.g., at or near a blocking voltage rating), which might otherwise penetrate to the Schottky metal (Schottky gate) 530, which can result in gate leakage.

Similar to the rectifier 100, the cell 500 includes the p+ subcontact region 521 and an Ohmic contact 541. The Schottky metal 530 and the Ohmic contact 541 are shorted by a metal layer used to implement the anode electrode 548 of the sub-cell 5000. Further, a metal layer can be used to establish an Ohmic contact with a backside of the substrate 501 to implement the cathode contact of the sub-cell 5000.

As shown in FIG. 5, the sub-cell 5000a (which can include the monolithically integrated MOSFET portion of the cell 500) can have certain features that are similar to feature of the rectifying diode portion of the cell 500 included in the sub-cell 5000. For instance, the sub-cell 5000a includes an n-type JFET region 503a, which can have a higher doping concentration than a doping concentration of the drift region.

In contrast with the sub-cell 5000, the sub-cell 5000a includes a gate dielectric 550 that is disposed on at least portion of a source (e.g., n-type) region 510a of the MOSFET, disposed on a body (e.g., p-type) region 520a and disposed on the JFET region 503a. In some implementations, the gate dielectric 550 can include silicon dioxide having a thickness between approximately 30 nm and 100 nm. The sub-cell 5000a also includes gate electrode 551 disposed on the gate dielectric 550, and an interlayer dielectric (ILD) 552, which electrically insulates the gate electrode 551 from the metal layer used to implement the anode terminal 148, where the anode terminal 148 also implements a source terminal of the monolithically integrated MOSFET. In some implementations, the gate electrode 551 can be electrically coupled with a gate pad, where the gate pad is disposed outside an active region of the cell 500. Accordingly, such a gate pad is not illustrated in FIG. 5.

In some implementations, doping profiles of the various elements of the sub-cell 5000a can be configured such that the monolithically integrated MOSFET has a positive threshold voltage, where the specific threshold voltage will depend on the particular implementation. Under a zero bias condition on the gate terminal 551, the MOSFET of the cell 5000a can be in an off-state, and can remain in the off-state even at a high positive bias applied to the substrate 501, which, in addition to being included in a cathode of the sub-cell 5000, implements (is included in) a drain terminal of the MOSFET of the sub-cell 5000a.

An active channel of the MOSFET of the cell 5000a can be induced in SiC crystal (in the body region 520a) adjacent to the gate dielectric 550, in response to a positive bias (e.g., above a threshold voltage of the MOSFET) being applied to the gate electrode 551, which will turn on the MOSFET, allowing conduction between the JFET region 503 and the source region 510a, through the induced active channel.

Is some implementations, such as in a large-area power device, the sub-cells 5000 and 5000a can each be mirrored (with the sub-cell 5000 being mirrored on the left side of the cell 500, and the sub-cell 5000a being mirrored on the right side of the cell 500) to produce a complete device unit cell. A plurality of such complete device unit cells can be arranged and, e.g., electrically connected in parallel, to form such a large-area power device.

While the sub-cells 5000 and 5000a have been discussed independently herein, in the cell 500. The sub-cells 5000 and 5000a can be physically included as portions of a single SiC device, e.g., as parts of a common unit cell, such as described above. For instance, the substrate 501, the drift region 502, the shielding body 522, the cathode/drain terminal 545 and the cathode/source terminal 548 can be common to both the sub-cell 5000 and the sub-cell 5000a, such as described above.

FIG. 6 is a diagram that schematically illustrates a plan view of a SiC rectifier 600. As shown in FIG. 6, the rectifier 600 can include an active region that includes a 1-dimensional array of linear unit cells 660. In some implementations, the unit cells 660 of the rectifier 100 can have structures such as the structure of the rectifier 100 of FIG. 1, the structure of the rectifier 400 of FIG. 4, or the structure of the cell 500 of FIG. 5. In some implementations, the unit cells 660 can combine certain features of the rectifiers and/or the cells shown in FIGS. 1, 4 and/or 5.

The active region of the rectifier 600 can further include a continuous p-n diode rim 670 disposed at a periphery of the rectifier 600 (e.g., around the active region of the rectifier 600). The rectifier 600 of FIG. 6 can still further include a termination region 671 that is disposed around the p-n diode rim 670. Different approaches (structures) for junction termination can be included in the termination region 671, where the particular termination structure used will depend on the implementation. In rectifier 600, the termination region 671 should have, e.g., a same or higher breakdown voltage as the active region of the rectifier 600.

FIGS. 7A and 7B are diagrams that schematically illustrate, respectively, plan views of unit cells 700a and 700b that can be included in a SiC rectifier (e.g., a large-area power rectifier). In some implementations, a LTO power rectifier can include a 2-dimensional array of unit cells, such as an array of the unit cells 700a or 700b. For instance, such an array can include a plurality of physically adjacent, and electrically connected polygonal unit cells.

Referring to FIG. 7A, a top (plan) view of a rectangular unit cell 700A is illustrated, which is described with further reference to FIG. 1. For purposes of clarity and illustration, only some elements of a rectifier cell are shown in FIG. 7A. For instance, as illustrated in FIG. 7A, the top plan view of the unit cell 700a includes an anode (n-type) implant region 710a, a p-body region 720a, a p+ subcontact region 721a, and an Ohmic contact 741A, which correspond to the regions 110, 120, 121 and 141, respectively, of the rectifier 100 in the cross-section in FIG. 1. For the unit cell 700a, positioning of the other elements (portions) of the rectifier 100 in the unit cell 700a can be determined by reference to FIG. 1. In some implementations, half-cells of the unit cell 700a can be re-arranged, as compared to the arrangement of the unit cell 100, such that the p-body region 720a of the unit cell 700A is disposed in its center, rather than at the edges of the unit cell 700a, as in FIG. 1 and FIG. 7A.

FIG. 7B is a top view plan layout of a LTO rectifier unit cell 700b. In the unit cell 700b, the elements of a LTO rectifying diode can be re-arranged, such that Ohmic contacts to n-type and to p-type regions are placed next to each other, rather than in a concentric arrangement, as in the unit cell 700a (and the rectifier 100). As shown in FIG. 7B, the unit cell 700b can include an anode (n-type) implant region 710b, a body (p-type) region 720b, a subcontact (p+) region 721b, and an Ohmic contact 741b, which elements correspond, respectively, with the elements 710a, 720a, 721a and 741a of the unit cell 700a. In some implementations, the unit cell 700b may have a smaller size than a comparable unit cell of the arrangement of the unit cell 700a.

In some implementations, 2-dimensional arrays of adjacent unit cells can be arranged so as to fill an active region, such as the active region of the rectifier 600 is filled with linear unit cells 660, e.g., within the p-n diode rim 670. In some implementations, such polygonal unit cells may not be rectangular (or square). For instance, such unit cells can be, for example, hexagonal, so as to form a lattice of hexagonal unit cells in an active region of a LTO power rectifier.

Figure 8A:
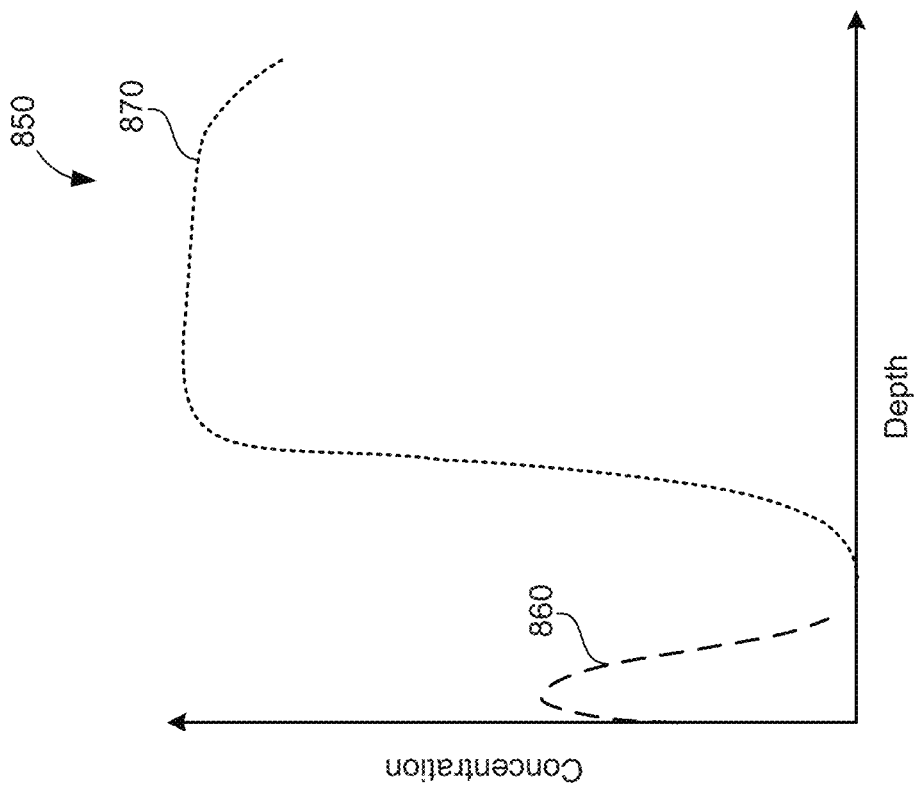
FIGS. 8A and 8B are graphs illustrating doping profiles for SiC rectifiers.
Figure 8B:
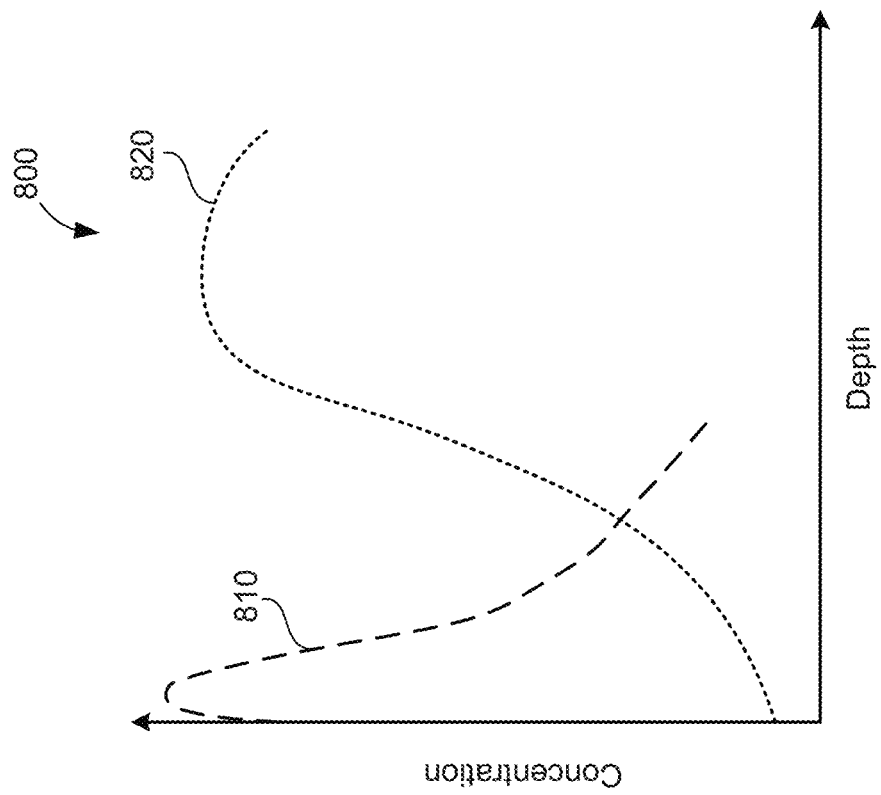

FIGS. 8A and 8B are graphs 800 and 850, respectively, illustrating doping profiles for LTO SiC rectifiers. Lines 810 and 860 illustrate donor doping profiles (e.g., for the channel 105 in FIG. 1). Lines 820 and 870 illustrate acceptor doping profiles (e.g., for the body region 120 in FIG. 1). Such doping profiles, as well as other device parameters should be considered when designing and producing LTO rectifiers, such as the rectifiers disclosed herein. For purposes of illustration, and by way of example, such considerations are discussed below with respect to FIG. 1, FIG. 5 and FIGS. 8A and 8B.

One design and processing consideration can relate to performance of a LTO rectifier (e.g., the rectifier 100) in high power applications. For instance, in order to produce a rectifier 100 with a blocking voltage between approximately 600 V and 4000 V, a doping level (doping concentration) of the drift region 102 should be approximately, for example, between $3e16$ cm$^{-3}$ and $2e15$ cm$^{-3}$. Another consideration is a doping (donor) concentration of the JFET region 103. In some implementations, the doping concentration of the JFET region 103 should higher than the doping (donor) concentration of the drift region 102, so as to reduce voltage drop across the JFET region 103 under forward bias of the rectifier 100. A doping level of the JFET region 103 can, for a particular implementation, depend, at least in part, on a doping level of the drift region 102, as well as on spacing between adjacent p-bodies 120. The doping of JFET region 103 can be configured to have a non-depleted state under zero-bias conditions, such that the JFET region 103 is conductive (normally on) under zero-bias conditions.

Design and manufacturing considerations for LTO rectifiers, such as the rectifier 100, can also include consideration of properties of the lateral channel 105. For instance, a threshold voltage $V_t$ of the channel 105 should be low, such as below a contact potential $V_c$ of the Schottky metal 130. For purposes of this disclosure, the threshold voltage $V_t$ can be defined as the gate-to-source difference in potential, where that potential difference ($V_t$) needs to be applied to open up the channel of the field-effect device (e.g., to cause the channel to conduct an on-state current). If $V_t$ of the channel 105 is above $V_c$, the on-state current of the rectifier 100 will bypass the lateral channel 105, which is not the intended operation of the LTO rectifier 100. Also, if $V_t$ of the channel 105 is a negative value, the LTO rectifier 100 may be unable to block voltage under reverse-bias conditions.

In some implementations, the lateral channel 105 should be thin (e.g., no more than tens of nanometers deep), and the lateral channel 105 should have a sufficiently high dose of donors, so as to reduce voltage drop associated with the lateral channel 105 (e.g., in an on-state condition). In some implementations, the donor implant dose in the lateral channel 105 can exceed, for example, 1e12 cm-2, but can be below 1e13 cm-2, so as to avoid adverse effects from high electric field at the Schottky metal 130. Also, the threshold voltage $V_t$ of the lateral channel 105 should, in some implementations, be a positive value, so as to prevent leakage under off-state conditions. That is, as discussed herein, the channel 105 should be normally off (e.g., at zero-bias conditions).

In some implementations, a lateral channel of an LTO rectifier, such as the lateral channel 105 can be a delta-doped channel. Such a delta-doped channel can have a donor dose of $Q_{ch}$ and a peak dopant (donor) concentration located at a depth of $H_{ch}$ from the Schottky metal (Schottky gate) 130. In this example, the threshold voltage $V_t$ will be given by Equation 2 below:

$$V_t = V_c - q^* Q_{ch}^* H_{ch}/\text{epsilon} \qquad \text{Equation 2,}$$

where $V_c$ is the contact potential of the Schottky metal (Schottky gate) 130, epsilon is the absolute permittivity of SiC, and q is the electron charge. As can be seen from Equation 2, a product of $Q_{ch}^* H_{ch}$ should remain low, in order to maintain positive threshold voltage $V_t$ of the channel 105. For a contact potential $V_c$ of the Schottky metal 130 between approximately 1 V and 1.7 V, the threshold voltage $V_t$ can remain positive if $H_{ch}$ does not exceed a few tens of nanometers (nm), e.g., 10 nm to 30 nm in some implementations. In some implementations, peak donor concentration in the channel 105 can be between approximately $4e17$ cm$^{-3}$ and $1e19$ cm$^{-3}$, depending, in part, on the channel thickness $H_{ch}$.

As noted above, given that a positive threshold voltage $V_t$ of the channel 105 is desirable, the depth $H_{ch}$ of the channel 105 should be small, a few tens of nanometers. However, a layer of such a thickness can be practically difficult to form with good reproducibility for certain manufacturing processes. Additionally, an achievable thickness of a graded region of the p-n junction between the channel 105 and the body region 120 may exceed the values of $H_{ch}$ discussed above. Accordingly, in some implementations, a doping profile of the channel 105 can be offset from a center of the channel 105 along its depth (e.g. $H_{ch}$) towards a surface (an upper surface) of the channel 105, e.g., towards its Schottky-barrier at the interface with the Schottky metal 130. Such a doping profile can be readily achieved, for example, by shallow implantation of donor ions, such as of nitrogen (N), or of arsenic (As), or of antimony (Sb). In some implementations, ion implantation can also provide accurate control of dopant dose in the channel dose, and control of a profile of that dopant dose.

Referring to FIGS. 8A and 8B, graphs 800 and 850 qualitatively illustrate, respectively, doping profiles for a fully implanted channel 105 implementation of an LTO rectifier (FIG. 8A), and a SiC regrowth implementation for the channel 105 of an LTO rectifier (FIG. 8B). In some implementations, a peak concentration of donors in FIGS. 8A and 8B will approximately correspond to $H_{ch}$.

In some implementations, such as fully implanted implementations (where SiC regrowth for formation of the channel 105 is not performed), implantation of the body (p-type) region 120 can be done with high-energy acceptor ions, where such high energy ions shoot through a near-surface region of the SiC crystal structure, so as to leave the near-surface region at a relatively low doping concentration. If an acceptor dose in the body region 120 is kept at a moderate value (e.g., using high-energy acceptor ions), the near-surface region can be used for forming an implanted lateral channel 105.

In some implementations, an implanted lateral channel 105 can be formed by ion implantation of donor ions, such as N, Phosphorus (P), As, or Sb. In some implementations, a thin film (e.g., of screening silicon oxide, or nitride) can be deposited prior to ion implantation of the channel region, so as to decrease a penetration depth of the donor ions used to form the channel 105. In some implementations, a peak acceptor concentration in the body region 120 may not substantially exceed a peak donor concentration in the channel 105. If, for example, the peak acceptor concentration in the body region 120 were to substantially exceed the peak donor concentration in the channel 105, this could adversely affect conductance of the channel 105.

In some implementations, a normally off channel in an LTO rectifier, such as the channel 105, can be formed using epitaxial regrowth of a nominally undoped n-type SiC layer on a SiC wafer in which body regions 120 are already formed. In some implementations, the anode (n-type) implant regions 100 can also be formed prior to epitaxial regrowth. Qualitative doping profiles of such an implementation are shown in FIG. 8B. As shown in FIG. 8B, as compared with FIG. 8A (for a fully implanted implementation), epitaxial regrowth can achieve a much more abrupt slope of acceptor doping than what can be achieved with ion implantation alone. In epitaxial regrowth implementations, after regrowth, donors can be implanted in the channel 105 (in the regrown layer) using a shallow donor implant. As shown in FIG. 8B, as compared to FIG. 8A, a higher acceptor doping concentration can be achieved in the body region 120 using regrowth, without a risk significant acceptor compensation of the channel region, e.g., because out diffusion of acceptors in SiC is very low due to low impurity diffusion rates in SiC materials. As a comparison, ion-implanted ion acceptor profiles, such as the profiles plotted in FIG. 8A, are not necessarily as abrupt.

In a fully implanted implementation of an LTO rectifier, electrical performance of the LTO rectifier can be improved using a deep, heavily doped p-body, which is spaced away from a lateral channel of the LTO rectifier, such as the deep p-body 522 of the cell 500 shown in FIG. 5. As shown in FIG. 5, the deep p-body 522 is spaced from the channel 505. In this example, the deep p-body 522 can have a much higher doping concentration than a doping concentration of the p-body 520, without deteriorating operation of the channel 505. Due to proximity of the deep p-body 522 to the p-body 520, the p-body 520 will be at least partially shielded by the deep p-body 522 at high reverse bias conditions.

Figure 9:
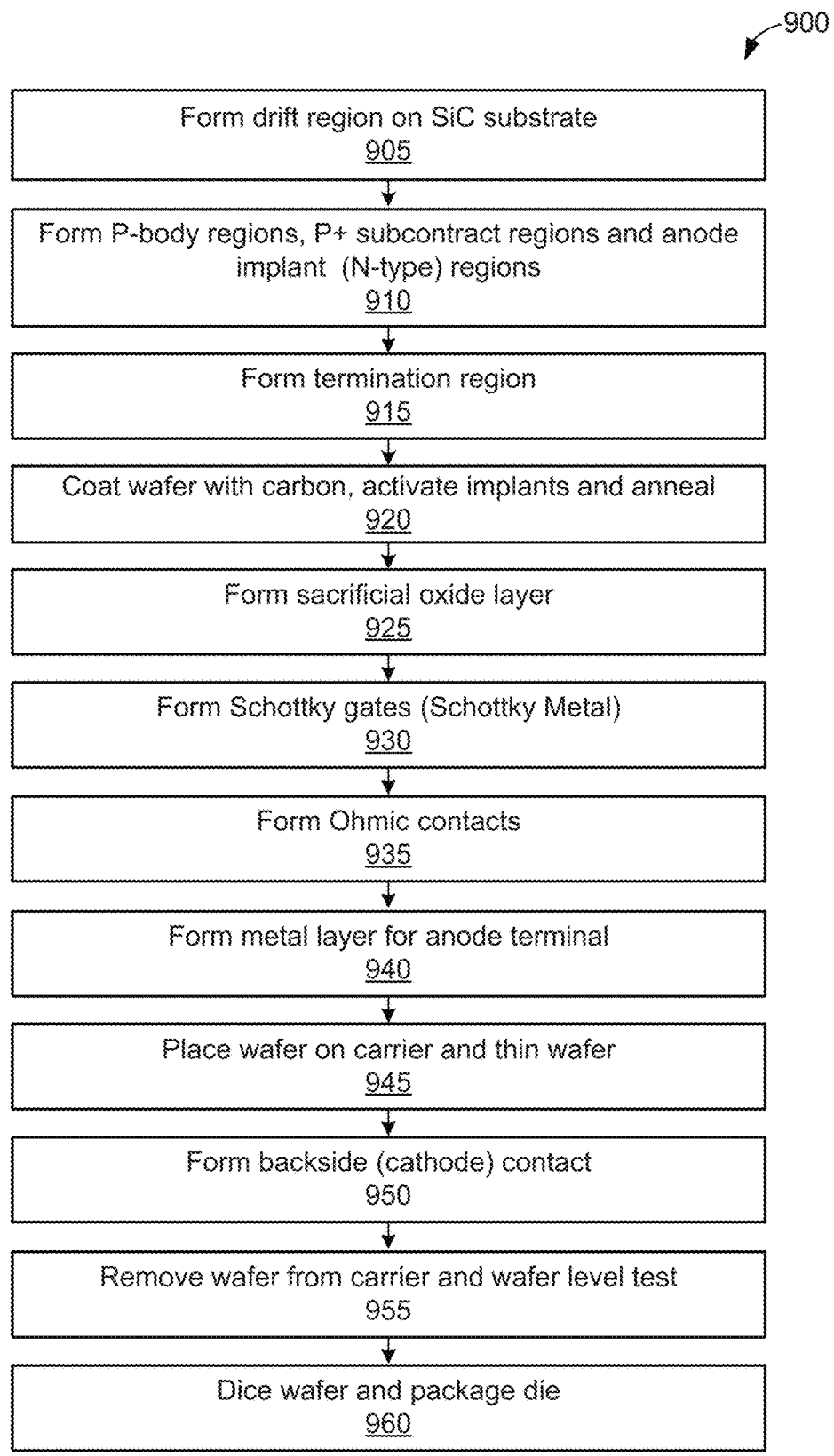
FIG. 9 is a flowchart illustrating a method of producing a SiC rectifier.

FIG. 9 is a flowchart illustrating a method 900 of producing a SiC rectifier. In some implementations, the LTO rectifier 100 can be produced using the method 900. Accordingly, for purposes of illustration, the method 900 will be described with further reference to the rectifier 100 of FIG. 1.

At block 905 of the method 900, the drift region 102 can be formed on the SiC substrate 101. For example, the drift region 102 can be formed using epitaxy on a heavily doped n-type SiC substrate, such as a substrate of 4H polytypes modification.

At block 910, the p-body regions 120 and the p+ subcontact regions 121 can be formed by implanting acceptor ions into the drift region 102, and the anode source regions 110 can be formed by implanting donor ions in the drift region 102. Topologies (locations) of the p-body region 120, the p+ subcontact regions 121 and the anode implant regions 110 can be defined using photolithography. In some implementations, exact offsets (spacing) between edges of the p-body regions 120 and the anode implant regions 110 can be achieved (established, defined, etc.) using self-alignment.

At block 915, a termination region can be formed by ion implantation into a peripheral region of the LTO rectifier device.

At block 920, the ion-implanted SiC wafer can be coated with a carbon layer prior to high-temperature activation of implanted ions and anneal of the substrate. Such a carbon layer can be formed by carbonizing a layer of photoresist, or by directly depositing carbon onto the wafer. Such a carbon coating can suppress surface erosion of a SiC surface during the implant activation and anneal, which can be performed at a temperature of, for example, between approximately 1500° C. and 1800° C. After the implant activation and anneal, at block 925, the carbon (e.g., graphite) coating can be removed. In some implementations, the carbon layer can be removed using an oxygen plasma or by annealing the wafer in oxygen-containing gas, so as to burn (oxidize) the carbon.

At block 930, a thin layer of sacrificial silicon dioxide can be grown to further improve surface quality of the ion-implanted SiC epitaxy (e.g., the drift region) layer. In some implementations, the sacrificial oxide layer can be later stripped off in hydrofluoric acid (HF) or in buffered HF. At block 935, the Schottky metal (Schottky gates) 130 can be formed by depositing a Schottky metal or heavily doped p-type polysilicon, which can form a relatively high barrier to SiC. At block 940, Ohmic contacts 141 can be formed, e.g., by sintering Ni to form NiSi. At block 945, a metal layer for the anode terminal 148 can be deposited and patterned.

At block 950, the SiC wafer, with a completed topside layer stack (e.g., implementing the LTO rectifier 100), can be placed on a carrier using an adhesive, and thinned so as to reduce substrate resistance. At block 955, a backside contact can be formed (e.g., to implement the cathode terminal 145). In some implementation, the backside contact of block 955 can be formed by laser sintering of deposited Ni, followed by deposition of a solder metal. The solder metal may be titanium/nickel/silver (Ti/Ni/Ag). At block 960, the wafer can be removed from the carrier, and wafer level testing can be performed. At block 965, the wafer can be diced and the die can be packaged.

It will understood, for purposes of this disclosure, that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A silicon carbide (SiC) rectifier comprising:
   a substrate of a first conductivity type, the substrate being included in a cathode terminal of a rectifying diode;
   a drift region of the first conductivity type, the drift region being disposed on the substrate;
   a junction field effect transistor (JFET) region of the first conductivity type, the JFET region being disposed on the drift region;
   a body region of a second conductivity type, the body region being disposed in the JFET region;
   an anode implant region of the first conductivity type, the anode implant region being disposed in the body region, the anode implant region being coupled with an anode terminal of the rectifying diode; and
   a channel of the first conductivity type, the channel being in contact with and disposed between the JFET region and the anode implant region, a portion of the channel between the anode implant region and the JFET region being disposed in the body region, the channel being configured to be off under zero-bias conditions, and on at a positive turn-on voltage.

2. The SiC rectifier of claim 1, wherein the JFET region is normally on.

3. The SiC rectifier of claim 1, further comprising a Schottky metal layer disposed on the channel and disposed on at least a portion of the anode implant region, the channel being configured to be gated by the body region and a Schottky contact between the Schottky metal layer and the channel, the gating of the channel being based on a bias voltage applied to the anode terminal of the rectifying diode, the positive turn-on voltage being less than a contact potential of the Schottky contact.

4. The SiC rectifier of claim 3, further comprising:
   a subcontact region of the second conductivity type, the subcontact region being disposed in the body region and adjacent to the anode implant region;
   a conductive layer forming an Ohmic contact with the subcontact region and the anode implant region; and
   a metal layer defining the anode terminal of the rectifying diode, the metal layer being disposed on the Schottky metal layer, the conductive layer for the Ohmic contact, and at least a portion of the anode implant region.

5. The SiC rectifier of claim 1, wherein the first conductivity type is n-type and the second conductivity type is p-type.

6. The SiC rectifier of claim 1, wherein the channel is a lateral channel that extends between the anode implant region and the JFET region, through the body region.

7. The SiC rectifier of claim 1, further comprising a charge balance pillar of the second conductivity type, the charge balance pillar being disposed in the drift region, the charge balance pillar extending from the body region into the drift region.

8. The SiC rectifier of claim 7, wherein a charge imbalance between the charge balance pillar and the drift region is $1 \times 10^{13}$ cm$^{-2}$.

9. The SiC rectifier of claim 1, further comprising a metal-oxide-semiconductor field-effect transistor (MOSFET) that is monolithically integrated with the rectifying diode in a unit cell of the SiC rectifier.

10. The SiC rectifier of claim 9, wherein the MOSFET is a vertical MOSFET having a common body region with the rectifying diode and a common drift region with the rectifying diode.

11. The SiC rectifier of claim 10, wherein the common body region extends through the JFET region and into the common drift region.

12. The SiC rectifier of claim 10, further comprising a subcontact region of the second conductivity type, the subcontact region being disposed in the common body region and electrically coupling the anode implant region with a source region of the MOSFET, the anode implant region and the source region being disposed in the common body region.

13. The SiC rectifier of claim 1, wherein the channel includes a regrown SiC layer implanted with donor ions.

14. A silicon carbide (SiC) rectifier, comprising:
a drift region of a first conductivity type;
a junction field effect transistor (JFET) region of the first conductivity type, the JFET region being disposed on the drift region;
a body region of a second conductivity type, the body region being disposed in the JFET region;
an anode implant region of the first conductivity type, the anode implant region being disposed in the body region, the anode implant region being coupled with an anode terminal of a rectifying diode;
a channel of the first conductivity type being in contact with and disposed between the JFET region and the anode implant region, a portion of the channel between the anode implant region and the JFET region being disposed in the body region, the channel being configured to be off under zero-bias conditions, and on at a positive turn-on voltage; and
a source region of a vertical metal-oxide-semiconductor field-effect transistor (MOSFET), the source region being disposed in the body region, the drift region being common to the rectifying diode and the vertical MOSFET.

15. The SiC rectifier of claim 14, further comprising a subcontact region of the second conductivity type, the subcontact region being disposed in the body region and electrically coupling the anode implant region with the source region.

16. The SiC rectifier of claim 14, further comprising a Schottky metal layer disposed on the channel and disposed on at least a portion of the anode implant region, the channel being configured to be gated by the body region and a Schottky contact between the Schottky metal layer and the channel, the gating of the channel being based on a bias voltage applied to the anode terminal of the rectifying diode, the positive turn-on voltage being less than a contact potential of the Schottky contact.

17. The SiC rectifier of claim 14, wherein the JFET region is normally on.

18. A silicon carbide (SiC) rectifier, comprising:
a drift region of a first conductivity type;
a junction field effect transistor (JFET) region of the first conductivity type, the JFET region being disposed on the drift region;
a body region of a second conductivity type, the body region being disposed in the JFET region;
an anode implant region of the first conductivity type, the anode implant region being disposed in the body region, the anode implant region being coupled with an anode terminal of a rectifying diode;
a channel of the first conductivity type, being in contact with and disposed between the JFET region and the anode implant region, a portion of the channel between the anode implant region and the JFET region being disposed in the body region, the channel being configured to be off under zero-bias conditions, and on at a positive turn-on voltage; and
a charge balance pillar of the second conductivity type, the charge balance pillar extending from the body region into the drift region.

19. The SiC rectifier of claim 18, wherein a charge imbalance between the charge balance pillar and the drift region is $1 \times 10^{13}$ cm$^{-2}$.

20. The SiC rectifier of claim 18, wherein the JFET region is normally on.

* * * * *